United States Patent
Zhang

(10) Patent No.: US 12,107,079 B2
(45) Date of Patent: Oct. 1, 2024

(54) DISPLAY PANEL AND DISPLAY DEVICE WITH ENHANCED THERMAL CONDUCTIVITY

(71) Applicant: Xiamen Tianma Micro-Electronics Co., Ltd., Xiamen (CN)

(72) Inventor: Yuheng Zhang, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 440 days.

(21) Appl. No.: 17/487,176

(22) Filed: Sep. 28, 2021

(65) Prior Publication Data

US 2022/0013507 A1    Jan. 13, 2022

(30) Foreign Application Priority Data

Apr. 1, 2021 (CN) .......................... 202110358188.7

(51) Int. Cl.
*H01L 25/075* (2006.01)
*H01L 33/44* (2010.01)
*H01L 33/62* (2010.01)
*H01L 33/64* (2010.01)

(52) U.S. Cl.
CPC .......... *H01L 25/0753* (2013.01); *H01L 33/44* (2013.01); *H01L 33/62* (2013.01); *H01L 33/641* (2013.01)

(58) Field of Classification Search
CPC ..... H01L 25/0753; H01L 33/44; H01L 33/62; H01L 33/641; H01L 33/642; H01L 25/167; H01L 33/647; H01L 27/3244; H10K 10/10; H10K 19/00; H10K 30/00; H10K 39/00; H10K 50/00; H10K 59/00; H10K 65/00; H10K 71/00; H10K 77/00; H10K 85/00; H10K 99/10; H10K 2101/00; H10K 2102/00
See application file for complete search history.

(56) References Cited

U.S. PATENT DOCUMENTS

2019/0326271 A1* 10/2019 Chi ..................... H01L 27/1218
2021/0408103 A1* 12/2021 Dai ....................... H01L 27/156

FOREIGN PATENT DOCUMENTS

| CN | 205213232 U | 5/2016 |
| CN | 108649136 A | 10/2018 |
| CN | 109859647 A | 6/2019 |
| CN | 111123591 A | 5/2020 |

* cited by examiner

*Primary Examiner* — Mohammad A Rahman
(74) *Attorney, Agent, or Firm* — Kilpatrick Townsend & Stockton LLP

(57) ABSTRACT

Provided are a display panel and a display device. The display panel includes a substrate, a driving circuit layer disposed on the substrate and including driving circuits, LED chips located on side of the drive circuit layer facing away from the substrate and each electrically connected to a corresponding drive circuit, the drive circuit includes at least one first thin film transistor with a source and a drain located at first metal layer of the drive circuit layer and electrically connected to first electrode of corresponding LED chip, and at least part of edges of the display panel is provided with thermally conductive adhesive. The substrate is also provided with one or more layers of thermally conductive metal, at least one layer of thermally conductive metal extends to the edges of the display panel and is in contact with the thermally conductive adhesive.

20 Claims, 10 Drawing Sheets

DISPLAY PANEL AND DISPLAY DEVICE WITH ENHANCED THERMAL CONDUCTIVITY

CROSS-REFERENCE TO RELATED APPLICATION(S)

This application claims priority to Chinese Patent Application No. 202110358188.7, titled "DISPLAY PANEL AND DISPLAY DEVICE" filed Apr. 1, 2021, the disclosure of which is incorporated herein by reference in its entirety.

FIELD

The present disclosure relates to the field of display technologies, and in particular, to a display panel and a display device.

BACKGROUND

With continuous development of the display technologies, mini light emitting diodes (mini-LED) or micro light emitting diodes (micro-LED) are gradually being applied in the field of display, due to their smaller size, higher luminous efficiency, and lower energy consumption.

A largest heat source of a mini-LED or a micro-LED comes from a LED chip. As no metal heat conduction path is provided at a bottom of an existing LED, heat can only be transferred through a film layer, causing an entire display panel to be warmed up, which affects the TFT characteristic and the panel reliability. The warmed display panel reduces the luminous efficiency of the micro-LED, and moreover, the higher the temperature of the display panel is, the shorter the service life of the micro-LED is, resulting in affecting a service life of the display panel.

SUMMARY

Embodiments of the present disclosure provide a display panel and a display device to enhance heat dissipation function of the display panel and prolong a service life of the display panel.

In some embodiments of the present disclosure provide an organic light emitting display panel, including: a substrate;
a driving circuit layer, and the driving circuit layer is disposed on the substrate and includes driving circuits;
LED chips, and the LED chips are located on a side of the driving circuit layer facing away from the substrate; the LED chips each is electrically connected to a corresponding driving circuit of the driving circuits; each driving circuit of the driving circuits includes at least one first thin film transistor; a source of the first thin film transistor and a drain of the first thin film transistor are located at a first metal layer of the driving circuit layer; the source of the first thin film transistor or the drain of the first thin film transistor is electrically connected to a first electrode of a corresponding LED chip of the LED chips; and
thermally conductive adhesive, and the thermally conductive adhesive is provided on at least part of edges of the display panel;
and the substrate is further provided with one or more layers of thermally conductive metal; at least one layer of the thermally conductive metal of the one or more layers of the thermally conductive metal extends to the edges of the display panel and is in contact with the thermally conductive adhesive.

In some embodiments of the present disclosure also provide a display device, and the display device includes the display panel provided by any embodiment of the present disclosure.

In the present disclosure, a driving circuit layer and LED chips are sequentially disposed on the substrate of the display panel, and the driving circuit layer includes driving circuits for driving corresponding LED chips, the driving circuit includes at least one first thin film transistor, the source and the drain of the first thin film transistor are located in the first metal layer, and the source or the drain of the first thin film transistor is connected to the first electrode of the corresponding LED chip; in addition, at least one layer of thermally conductive metal is disposed on the substrate, the thermally conductive metal can extend to the edges of the display panel and connect with the thermally conductive adhesive.

DETAILED DESCRIPTION OF THE EMBODIMENTS

Figure 1:
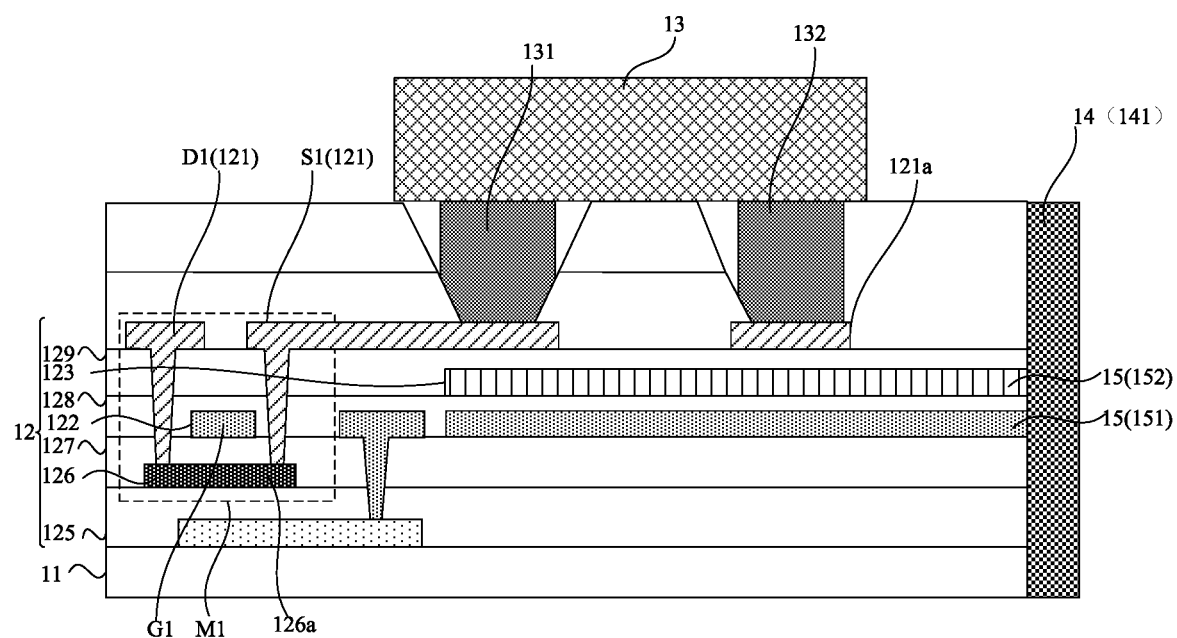
FIG. 1 is a schematic structure view of a display panel provided by an embodiment of the present disclosure.

The present disclosure is to be further described in detail with reference to the accompanying drawings and embodiments. It can be understood that, the embodiments described herein are only used to explain the present disclosure, rather than limitations of the present disclosure. In addition, it should be noted that, for the convenience of description, the drawings only show part of rather than all of the structure related to the present disclosure.

The embodiments of the present disclosure provide a display panel, including: a substrate, a driving circuit layer, LED chips, and thermally conductive adhesive.

The driving circuit layer is disposed on the substrate and includes driving circuits. The LED chips are located on a side of the drive circuit layer facing away from the substrate. The LED chips each is electrically connected to a corresponding drive circuit. The drive circuit includes at least one first thin film transistor, and the source and the drain of the first thin film transistor are located at a first metal layer of the drive circuit layer; the source or the drain of the first thin film transistor is electrically connected to a first electrode of a corresponding LED chip.

The thermally conductive adhesive is provided on at least part of the edges of the display panel.

The substrate is also provided with one or more layers of thermally conductive metal, and at least one layer of the thermally conductive metal extends to the edges of the display panel and is in contact with the thermally conductive adhesive.

In the embodiment of the present disclosure, a driving circuit layer and LED chips are sequentially disposed on the substrate of the display panel, and the driving circuit layer includes driving circuits for driving corresponding LED chips. The driving circuit includes at least one first thin film transistor. The source and the drain of the first thin film transistor are located at the first metal layer, and the source or the drain of the first thin film transistor is connected to the first electrode of the corresponding LED chip. In addition, at least one layer of thermally conductive metal is disposed on the substrate, the thermally conductive metal can extend to the edges of the display panel and connect with the thermally conductive adhesive, so that the thermally conductive metal can transfer heat from the display panel to the edges for dissipation, so that the heat radiated from the largest source of the display panel, the LED chips, to the display panel film layer can obtain a metal heat conduction path for external dissipation, which effectively lowers the temperature of the LED chips, ameliorates the problem of low luminous efficiency of the LED chips, improves the characteristics of the first thin film transistor, and enhances the reliability of the display panel.

The solutions of the present disclosure are to be clearly and completely described below with reference to the accompanying drawings of the embodiments of the present disclosure.

FIG. 1 is a schematic structure view of a display panel provided by an embodiment of the present disclosure. As shown in FIG. 1, the display panel includes a substrate 11, a driving circuit layer 12 and LED chips 13, the driving circuit layer 12 and the LED chips 13 are disposed on the substrate 11 in sequence. The driving circuit layer 12 includes driving circuits (not shown in FIG. 1) disposed in an array. The LED chips 13 are disposed, and each LED chip 13 is electrically connected to a corresponding driving circuit, so that the corresponding driving circuit drives the LED chip 13 to emit light. In an embodiment, the driving circuit includes at least one first thin film transistor M1, and the first thin film transistor M1 can be used as a driving tube for driving the corresponding LED chip 13. A source S1 and a drain D1 of the first thin film transistor M1 are located at a first metal layer 121 in the driving circuit layer 12. A first electrode 131 of the LED chip 13 is electrically connected to the source S1 or the drain D1 of the first thin film transistor M1 in the corresponding driving circuit, so that the LED chip 13 can be driven to emit light. By way of example, as shown in FIG. 1, the first electrode 131 of the LED chip 13 is electrically connected to the source S1 of the first thin film transistor M1 in the corresponding driving circuit. In this embodiment, one or more layers of thermally conductive metal 15 are also disposed on the substrate, and at least one layer of thermally conductive metal 15 can extend to edges of the display panel, to provide a metal heat conduction path for each film layer in the display panel, to transfer the heat in the display panel to the edges of the display panel for dissipation. As the light emitting source, the LED chip 13 is also the largest heat source of the entire display panel. The heat radiated from the LED chip 13 is transferred to the display panel through the film layer, and the thermally conductive metal 15 can further dissipate the heat to the outside of the display panel. As shown in FIG. 1, in this embodiment, at least part of the edges of the display panel is disposed with the thermally conductive adhesive 14 and is in contact with the thermally conductive metal 15 extending to the edges of the display panel, which can further enhance heat dissipation of the display panel and improve heat dissipation efficiency of the display panel. In addition, in this embodiment, the thermally conductive metal 15 and the thermally conductive adhesive 14 cooperate with each other, so that the heat from each film layer of the display panel can be quickly dissipated, to prevent high temperature of the display panel from affecting the performance of the thin film transistor, ameliorate the problem of low luminous efficiency of the LED chips due to high temperature, improve reliability of the display panel and prolong the service life of the display panel.

In an embodiment, the LED chips each may be a mini-LED chip or a micro-LED chip. The micro-LED technology refers to LED miniaturization and matrix technology. The micro-LED uses LED crystals with 1-10 micron that are narrower than a hair, and it has the characteristics of RGB three-color self-luminescence, which can achieve real pixel-level light control. Compared with OLED technology, under a same power, the micro-LED is characterized by higher brightness and longer service life. The mini-LED uses LED crystals with microns with small size and special-shaped cutting characteristics, to ensure low production difficulty and high yield. Herein, the special-shaped cutting refers to a C-angle or R-angle cutting around a display screen, or a cutting for a reserved hole of a cutout display screen and the like. Both the mini-LED chip and the micro-LED chip can realize high-resolution pixel display and improve the display effect of the display panel.

Figure 2:
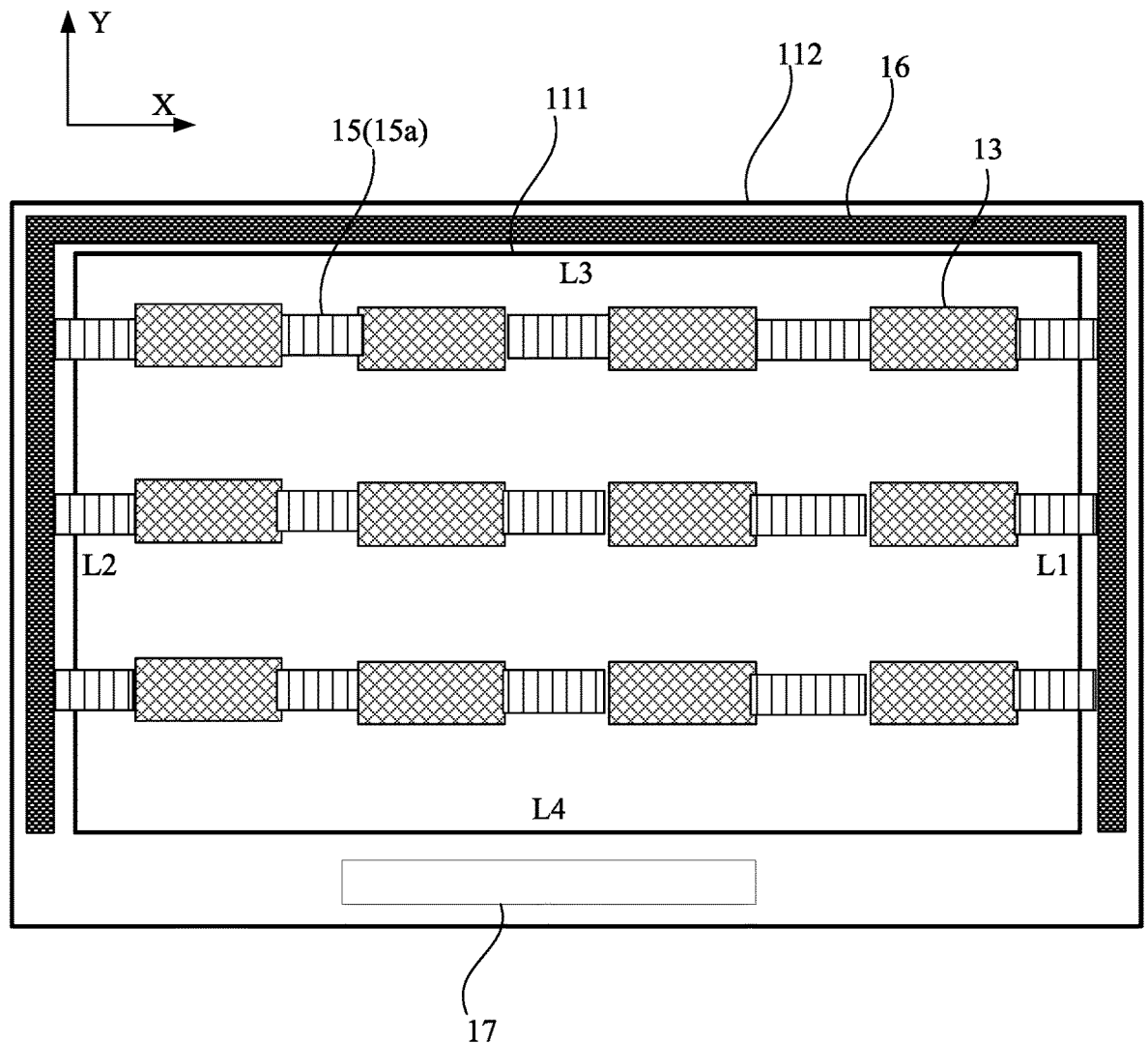
FIG. 2 is a top view of a display panel provided by an embodiment of the present disclosure.

FIG. 2 is a top view of a display panel provided by an embodiment of the present disclosure. In an embodiment, the display panel may include a display region 111 and a non-display region 112. The LED chips 13 are located in the display region 111. The non-display region 112 further includes a ground wire 16. The ground wire 16 is disposed around the display region 111 and is electrically connected to the thermally conductive metal 15.

Figure 3:
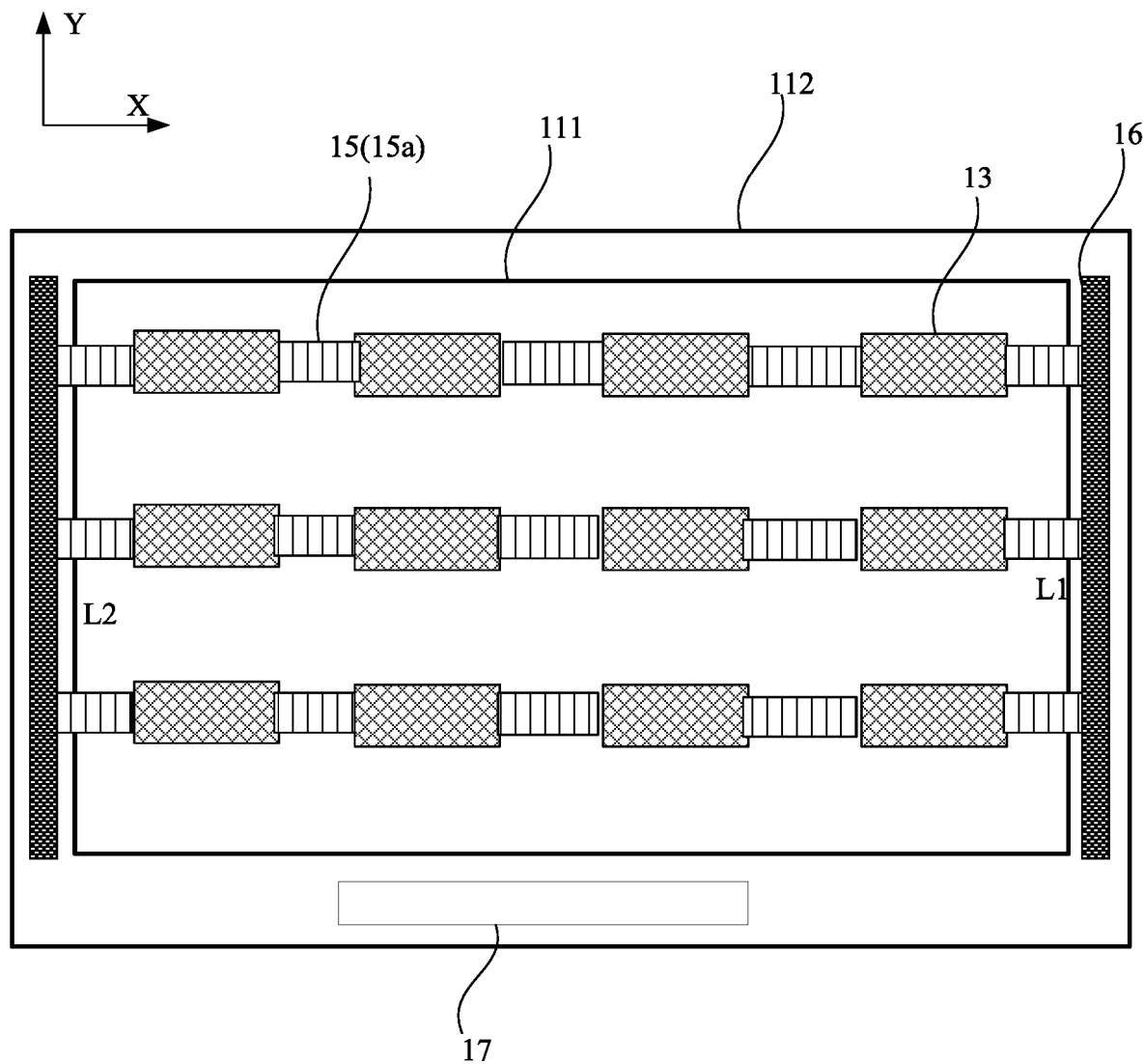
FIG. 3 is a top view of a display panel provided by another embodiment of the present disclosure.

In this embodiment, the thermally conductive metal 15 can be connected to the ground wire 16. As shown in FIG. 2, the ground wire 16 can be disposed around the display region 111, and the ground wire 16 has a larger arrangement region on a plane where the display panel is located, connecting the thermally conductive metal 15 to the ground wire 16, and the heat dissipation of the display panel can be further enhanced with the ground wire 16. In addition to the arrangement of ground wire in FIG. 2, in an embodiment, as shown in FIG. 3, FIG. 3 is a top view of a display panel provided by another embodiment of the present disclosure, the ground wire 16 may be divided into segments, the segments of ground wire 16 are disposed around the display region 111, and each segment of the ground wire 16 can be electrically connected to the thermally conductive metal 15, to dissipate the heat of the thermally conductive metal 15, protecting the thin film transistor and the LED chips 13. It should be noted that, the ground wire 16 is respectively connected to the thermally conductive metal 15 and the thermally conductive adhesive, to dissipate the heat from the thermally conductive metal 15 to the thermally conductive adhesive, accelerating heat dissipation of the display panel. In addition, the thermally conductive metal 15 can obtain a stable zero potential by connecting to the ground wire 16, which can avoids that signals from other metal layers in the drive circuit layer affect the potential of the thermally conductive metal 15.

Figure 4:
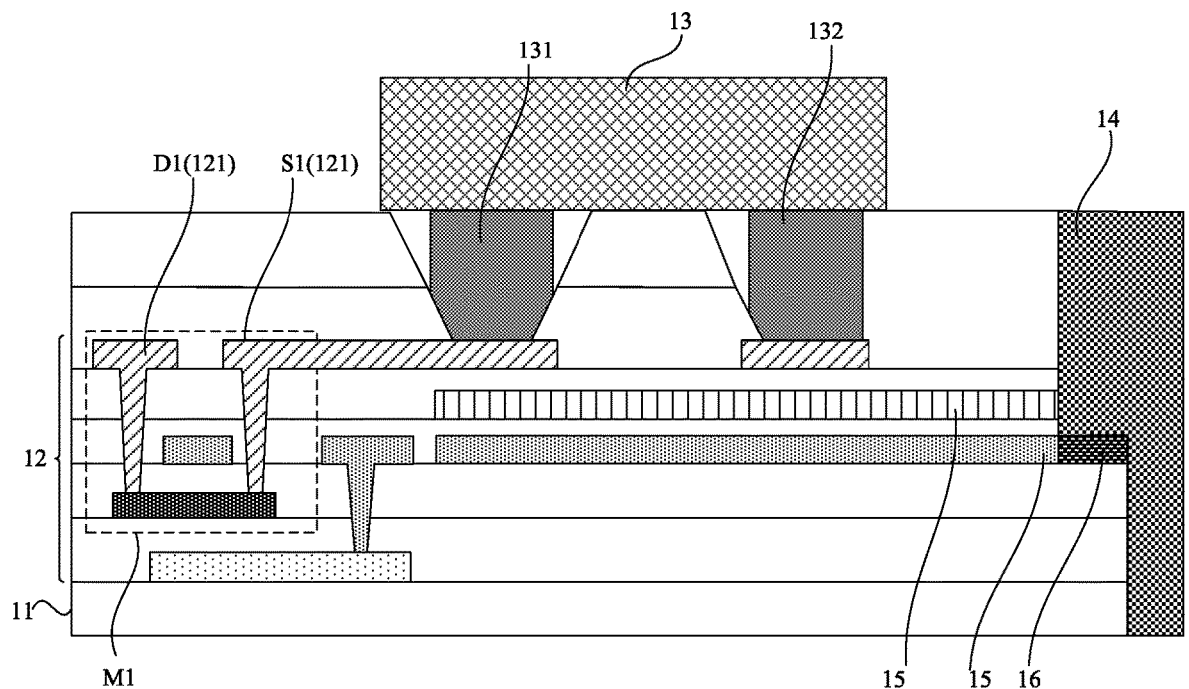
FIG. 4 is a schematic structure view of a display panel provided by another embodiment of the present disclosure.

FIG. 4 is a schematic structure view of a display panel provided by another embodiment of the present disclosure. In an embodiment, the driving circuit layer may include metal layers and insulating layers, and the metal layers and the insulating layers are alternately disposed. The insulating layer on a side of the ground wire 16 facing away from the substrate 11 is provided with a groove structure 18. A vertical projection of the groove structure 18 on the plane where the substrate 11 is located covers the ground wire 16, and the thermally conductive adhesive 14 fills the groove structure 18.

The driving circuit layer includes alternately disposed metal layers and insulating layers, and the ground wire 16 may be disposed at a metal layer of the driving circuit layer. The ground wire 16 is disposed in the non-display region, in this embodiment, the groove structure 18 may be formed by removing or grooving the insulating layer on the side of the ground wire 16 facing away from the substrate 11, and is filled with the thermally conductive adhesive 14, to increase the contact area between the thermally conductive adhesive 14 and the ground wire 16, enhancing heat dissipation efficiency of the display panel. In this embodiment, the vertical projection of the groove structure 18 on the plane where the substrate 11 is located covers the ground wire 16, which can further increase the contact area between the thermally conductive adhesive 14 and the ground wire 16, speeding up heat dissipation and improving the performance of the display panel.

In an embodiment, with reference to FIG. 4, the vertical projection of at least one layer of thermally conductive metal 15 on the plane where the substrate 11 is located may at least partially overlap the LED chips 13. As the LED chips 13 are the main heat source of the display panel, the heat radiated from the LED chips 13 will be conducted from the film layer to the substrate 11. In this embodiment, the thermally conductive metal 15 can be disposed close to the LED chips 13. In an embodiment, in the plane where the substrate 11 is located, at least one layer of thermally conductive metal 15 can at least partially overlap the LED chips 13, so that the heat radiated from the LED chips 13 can be conducted to the thermally conductive metal 15 quickly and effectively, which allows the thermally conductive metal 15 to quickly conduct heat to the edges of the display panel, realizing rapid heat dissipation of the display panel.

In an embodiment, at least one metal film layer of the driving circuit layer 12 can also serve as the thermally conductive metal 15. In this embodiment, the driving circuit layer 12 can be disposed in an existing metal film layer, there is no need to additionally provide a metal layer or an insulating layer, which reduces manufacturing processes, effectively reducing an overall thickness of the display panel, and improving production efficiency of the display panel. In an embodiment, in a case where the thermally conductive metal layers 15 are provided, the metal film layers of the driving circuit layer 12 can also serve as the thermally conductive metal layers 15.

With further reference to FIG. 1, in an embodiment, the thermally conductive metal 15 may include: a first thermally conductive metal 151 and a second thermally conductive metal 152. The driving circuit layer 12 includes: a second metal layer 122, a third metal layer 123, and a first metal layer 121. The second metal layer 122 includes the gate G1 of the first thin film transistor M1, a first plate of a capacitor, and the first thermally conductive metal 151. The third metal layer 123 includes a second plate of the capacitor and the second thermally conductive metal 152. The first metal layer 121 is disposed on a side of the third metal layer 123 facing away from the substrate 11 and includes a common electrode 121*a*. The common electrode 121*a* is electrically connected to a second electrode 132 of an LED chip 13.

In this embodiment, two layers of thermally conductive metal 15 can be disposed: a first thermally conductive metal 151 and a second thermally conductive metal 152, the layers of heat dissipating metal can enhance heat dissipation efficiency of the display panel, and two metal layers in the driving circuit layer 12 can also serve as the first thermally conductive metal 151 and the second thermally conductive metal 152 described above. In an embodiment, in addition to that the driving circuit layer 12 includes the first metal layer 121 to form the source S1 and the drain D1 of the first thin film transistor M1, the driving circuit layer 12 may further include a second metal layer 122 and a third metal layer 123. In the direction facing away from the substrate 11, the second metal layer 122, the third metal layer 123, and the first metal layer 121 are sequentially arranged, where the gate G1 of the first thin film transistor M1 and the first plate of the capacitor, as well as the first thermally conductive metal 151 are formed at the second metal layer 122, the second plate of the capacitor, and the second thermally conductive metal 152 are formed at the third metal layer 123. Two metal layers of the driving circuit layer 12 can also serve as the first thermally conductive metal 151 and the second thermally conductive metal 152, which can enhance heat dissipation to the driving circuit layer 12 and reduce manufacturing processes of the display panel. It should be noted that, the first metal layer 121 is also provided with a common electrode 121*a*, and the common electrode 121*a* is electrically connected to the second electrode 132 of the LED chip 13 to provide the second electrode 132 with a negative potential.

In a specifical example of this embodiment, as shown in FIG. 1, the thermally conductive metal 15 may include: a first thermally conductive metal 151 and a second thermally conductive metal 152. The driving circuit layer includes: a buffer layer 125, an active structure layer 126, a gate insulating layer 127, the second metal layer 122, a capacitor dielectric layer 128, the third metal layer 123, an interlayer insulating layer 129, and the first metal layer 121. The buffer layer 125 is disposed on the substrate 11. The active structure layer 126 is disposed on a side of the buffer layer 125 facing away from the substrate 11 and includes an active layer 126*a* of the first thin film transistor M1. The gate insulating layer 127 is disposed on a side of the active structure layer 126 facing away from the substrate 11. The second metal layer 122 is disposed on a side of the gate insulating layer 127 facing away from the substrate 11, and includes the gate G1 of the first thin film transistor M1, the first plate of the capacitor, and the first thermally conductive metal 151. The capacitor dielectric layer 128 is disposed on a side of a gate G1 layer facing away from the substrate 11. The third metal layer 123 is disposed on a side of the capacitor dielectric layer 128 facing away from the substrate 11, includes the second plate of the capacitor and the second thermally conductive metal 152. The interlayer insulating layer 129 is disposed on a side of the third metal layer 123 facing away from the substrate 11. The first metal layer 121 is disposed on a side of the interlayer insulating layer 129 facing away from the substrate 11 and includes the common electrode 121*a*. The common electrode 121*a* is electrically connected to the second electrode 132 of the LED chip 13. This embodiment is only used as an example of a stacked structure of the driving circuit layer, and the first thin film transistor M1 is defined as a top gate structure. Of course, the first thin film transistor M1 in this embodiment may also be a bottom gate structure or a double gate structure. This embodiment does not limit the specific type of the first thin film transistor M1, nor does it limit a specific film layer stack manner of the driving circuit layer.

Figure 5:
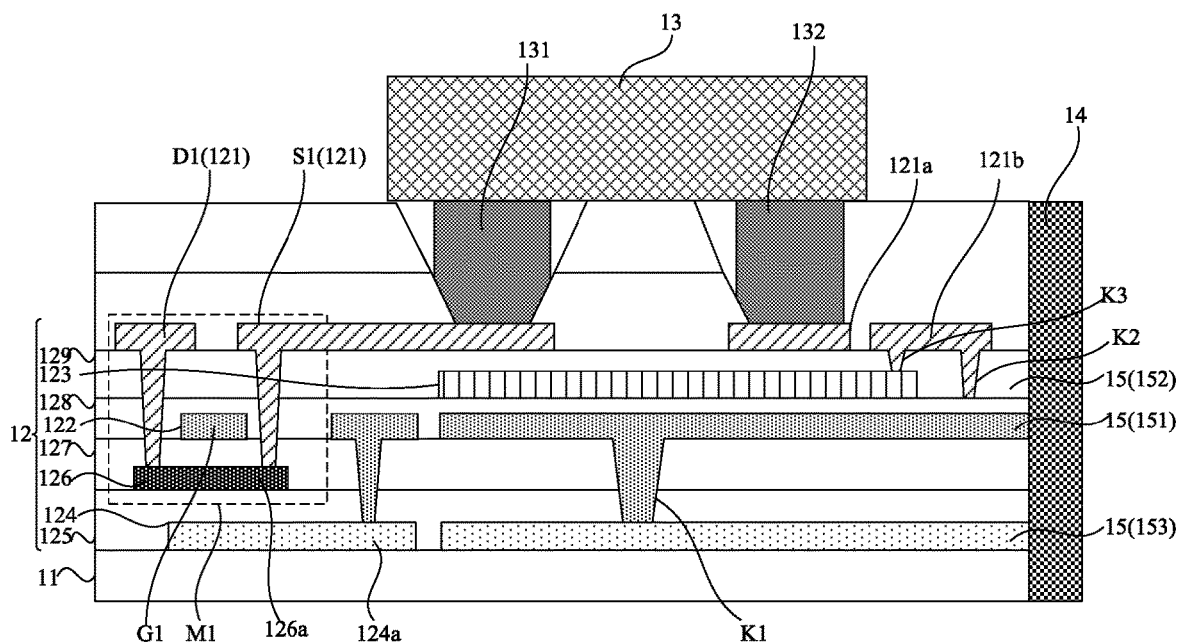
FIG. 5 is a schematic structure view of a display panel provided by another embodiment of the present disclosure.

FIG. 5 is a schematic structure view of a display panel provided by another embodiment of the present disclosure. In an embodiment, the thermally conductive metal 15 may further include a third thermally conductive metal 153. The driving circuit layer 12 may further include: an active structure layer 126, a fourth metal layer 124. The active structure layer 126 includes an active layer 126a of the first thin film transistor M1. The fourth metal layer 124 is disposed between the substrate 11 and the active structure layer 126, and includes a light-shielding layer 124a and a third thermally conductive metal 153. A projection of the light-shielding layer 124a on the plane where the substrate 11 is located covers the active layer 126a. The light-shielding layer 124a is insulated from the third thermally conductive metal 153.

In this embodiment, the driving circuit layer 12 further includes the fourth metal layer 124. The fourth metal layer 124 may be disposed between the substrate 11 and the active structure layer 126, and may be provided with the light shielding layer 124a. The projection of the light shielding layer 124a on the plane where the substrate 11 is located covers the active layer 126a, to prevent external light from irradiating the active layer 126a, which may cause fluctuations in output driving signals. The fourth metal layer 124 may also be provided with a third thermally conductive metal 153, adding a layer of thermally conductive metal, to further improve heat dissipation efficiency. Based on the above embodiments, the driving circuit layer 12 includes the fourth metal layer 124, the second metal layer 122, the third metal layer 123, and the first metal layer 121 that are sequentially disposed facing away from the substrate 11. The fourth metal layer 124, the second metal layer 122, and the third metal layer 123 are all provided with thermally conductive metal, which can realize rapid heat dissipation and improve reliability of the panel.

With further reference to FIG. 5, in an embodiment, in the first thermally conductive metal 151, the second thermally conductive metal 152 and the third thermally conductive metal 153, at least two adjacent layers of thermally conductive metals 15 are electrically connected. By way of example, as shown in FIG. 5, in a case where the first thermally conductive metal 151 and the third thermally conductive metal 153 are electrically connected, the potential of the multi-layer thermally conductive metal is uniform, and would not affect signals from other film layers, to maintain stable display of the display panel. In an embodiment, in the first thermally conductive metal 151, the second thermally conductive metal 152, and the third thermally conductive metal 153, every two adjacent thermally conductive metals are electrically connected to further improve stability of the display panel.

On the basis of the above embodiments, the first thermally conductive metal 151 in this example may be electrically connected to the third thermally conductive metal 153 through a first through hole K1 passing through the buffer layer 125 and the gate insulating layer 127. The first metal layer 121 further includes a bridge structure 121b. The first thermally conductive metal 151 is electrically connected to the bridge structure 121b through a second through hole K2 passing through the capacitor dielectric layer 128 and the interlayer insulating layer 129. The second thermally conductive metal 152 is electrically connected to the bridge structure 121b through a third through hole K3 passing through the interlayer insulating layer 129.

Figure 6:
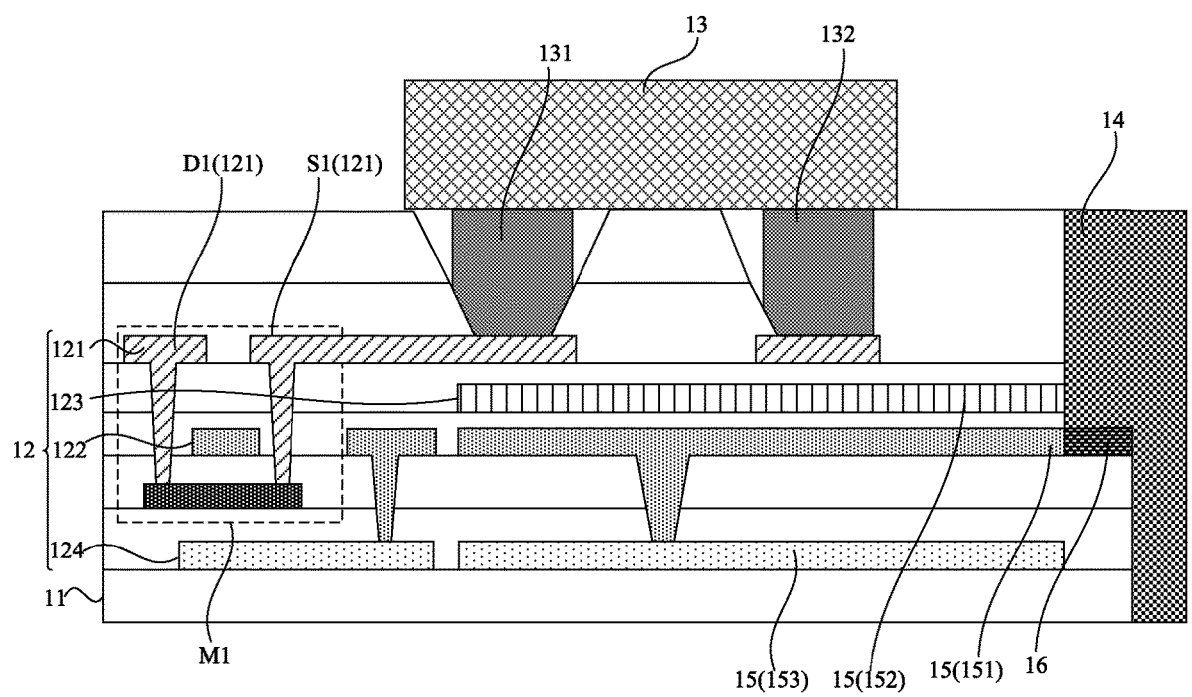
FIG. 6 is a schematic structure view of a display panel provided by another embodiment of the present disclosure.

FIG. 6 is a schematic structure view of a display panel provided by another embodiment of the present disclosure. With reference to FIG. 2 and FIG. 6, in an embodiment, the display panel may include a display region 111 and a non-display region 112. The non-display region 112 further includes the ground wire 16. The ground wire 16 is electrically connected to at least one layer of thermally conductive metal 15. The ground wire 16 is disposed at the first metal layer 121; or, the ground wire 16 is disposed on the second metal layer 122; or, the ground wire 16 is disposed at the third metal layer 123; or, the ground wire 16 is disposed at the fourth metal layer 124.

The display panel may be provided with layers of thermally conductive metal 15, and at least one layer of thermally conductive metal 15 is electrically connected to the ground wire 16. By way of example, as shown in FIG. 6, the driving circuit layer 15 includes a fourth metal layer 124, a second metal layer 122, a third metal layer 123, and a first metal layer 121 that are sequentially disposed facing away from the substrate 11, and the ground wire 16 can be disposed on any of the above-mentioned metal layers. In an embodiment, in a case where the first thermally conductive metal 151, the second thermally conductive metal 152, and the third thermally conductive metal 153 are provided, the fourth metal layer 124 may be provided with the ground wire 16 and the third thermally conductive metal 153, where the ground wire 16 is electrically connected to the third thermally conductive metal 153 directly; or, the second metal layer 122 may be provided with the first thermally conductive metal 151 and the ground wire 16, where the ground wire 16 is electrically connected to the first thermally conductive metal 151 directly; or, the third metal layer 123 may be provided with the second thermally conductive metal 152 and ground wire 16, where the ground wire 16 is electrically connected to the second thermally conductive metal 152 directly. In an embodiment, the ground wire 16 is disposed at the first metal layer 121, and the ground wire 16 is electrically connected to other thermally conductive metals through the through holes. FIG. 6 only shows the case where the ground wire 16 is located at the second metal layer 122, and this embodiment includes but is not limited to the case shown in FIG. 6.

With further reference to FIG. 3, in an embodiment, at least one layer of thermally conductive metal 15 may include stripe structures 15a extending in a first direction X. A first end of the stripe structure 15a is connected to a ground wire segment close to a first edge L1 of the display region 111. A second end of the stripe structure 15a is connected to a ground wire segment close to a second edge L2 that is opposite to the first edge L1 of the display region 111. The LED chips 13 form an array structure arranged in rows in the first direction X and in columns in a second direction Y. A vertical projection of the stripe structures 15a on the plane where the substrate 11 is located covers a corresponding row of LED chips 13. The first direction X and the second direction Y intersect.

In this embodiment, in the plane where the substrate 11 is located, the LED chips 13 in the display region 111 may be arranged in rows in the first direction X and in columns in the second direction Y. The thermally conductive metal 15 in this embodiment may include stripe structures 15a, and the stripe structure 15a may extend in the first direction X or in the second direction Y. In this embodiment, the extension in the first direction X is taken as an example. The ends of the stripe structures 15*a* are connected to the ground wire segments in the non-display region 112. The projection of the stripe structures 15*a* on the substrate 11 covers a row of LED chips 13, so that the stripe structure 15*a* can conduct the heat radiated from that row of LED chips 13 to the ground wire 16 in time. In this embodiment, at least one layer of thermally conductive metal 15 forms the stripe structures 15*a*. In an embodiment, all thermally conductive metal layers 15 form the stripe structures 15*a*, which dissipates the heat from the LED chips 13 and improves heat dissipation efficiency of the display panel. Meanwhile, the stripe structures 15*a* of the thermally conductive metal 15 occupy a small area on the plane where the substrate 11 is located, compared with the entire block arrangement of the thermally conductive metal 15, it can save a plane space for arranging the drive circuits, and makes it possible to further increase pixel resolution; in addition, the capacitance between the thermally conductive metal 15 and other metal layers can be reduced, improving display stability of the display panel.

With further reference to FIG. 2, in an embodiment, the display region 111 may include a first edge L1, a third edge L3, a second edge L2, and a fourth edge L4 that are sequentially connected; where, the first edge L1 and the second edge L2 are oppositely disposed in the first direction X, and the third edge L3 and the fourth edge L4 are oppositely disposed in the second direction Y. The display panel further includes: a binding region 17. The binding region 17 is located in the non-display region 112 and is disposed close to the fourth edge L4 of the display region 111. The ground wire 16 is disposed around the first edge L1, the third edge L3, and the second edge L2 of the display region 111.

In this embodiment, the ground wire 16 is disposed around the display region 111 and avoids a side of the binding region 17. By way of example, the display region 111 may include a first edge L1, a third edge L3, a second edge L2, and a fourth edge L4 that are sequentially connected. The first edge L1 and the second edge L2 are oppositely disposed in the first direction X, and the third edge L3 and the fourth edge L4 are oppositely disposed in the second direction Y. The ground wire 16 is disposed on the first edge L1, the third edge L3, and the second edge L2 of the display region 111. In this embodiment, the stripe structures 15*a* extend in the first direction X, so that both ends of each stripe structure 15*a* can be connected to the ground wire 16, which further accelerates heat dissipation of the display panel.

Figure 7:
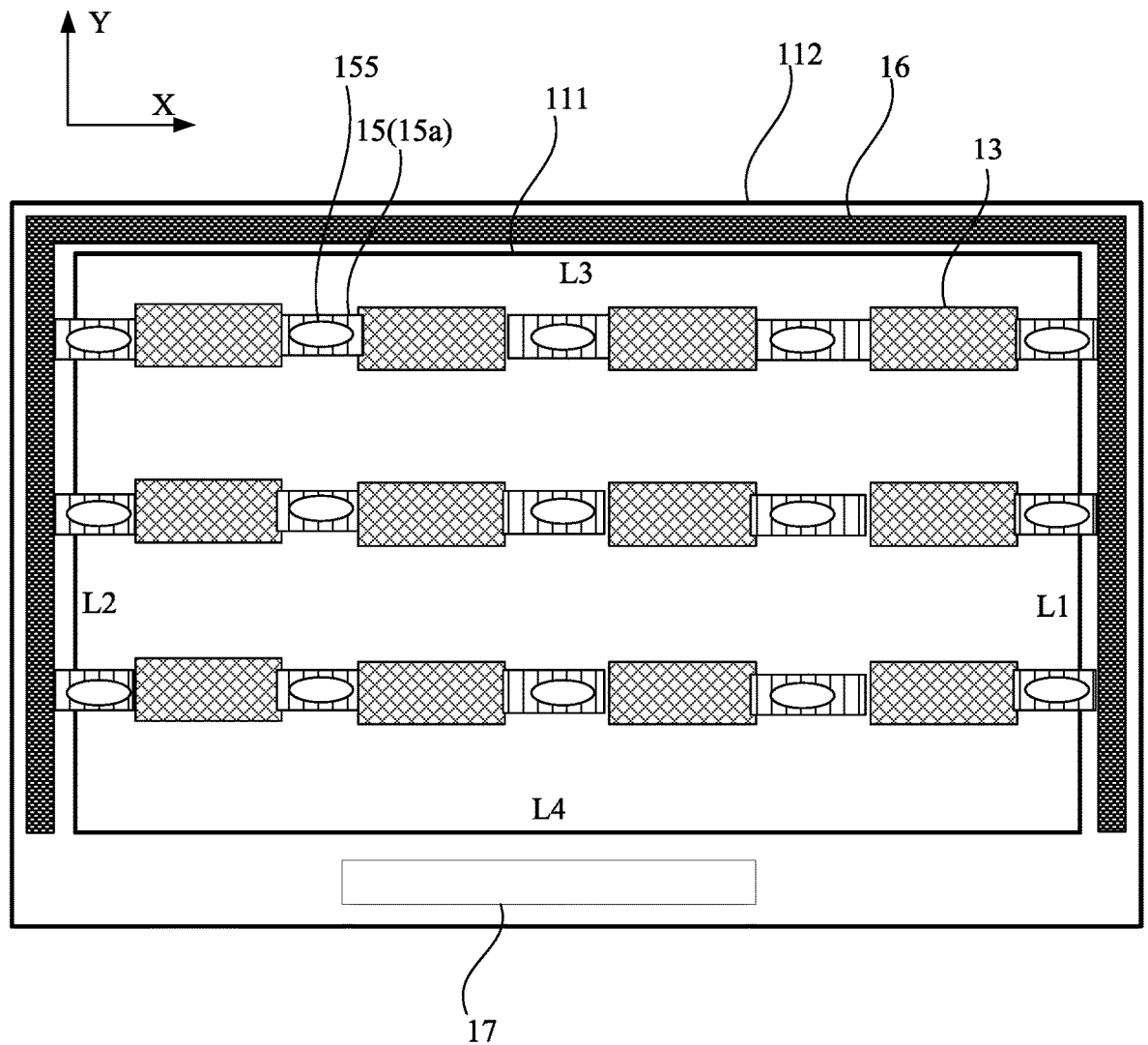
FIG. 7 is a top view of a display panel provided by an embodiment of the present disclosure.

FIG. 7 is a top view of a display panel provided by an embodiment of the present disclosure. In an embodiment, hollow patterns 155 may be provided on the stripe structures 15*a*. A vertical projection of the hollow pattern 155 on the plane where the substrate 11 is located at least partially overlaps the driving circuit layer. On the basis of the above embodiment, the hollow patterns 155 may be provided on the stripe structures 15*a*, to reduce the areas of the stripe structures 15*a* on the plane where the substrate is located 11, reducing the capacitance between the thermally conductive metal and other metal film layers. In an embodiment, the vertical projection of the hollow pattern 155 on the plane where the substrate is located 11 at least partially overlaps the driving circuit layer, that is, to reduce a facing area of the stripe structure 15*a* and the driving circuit, reducing the capacitance between the thermally conductive metal and other metal layers.

With further reference to FIG. 1, in an embodiment, the thermally conductive adhesive 14 may include a first portion 141; the first portion 141 is attached to an edge side of the display panel. The thermally conductive adhesive 14 includes the first portion 141, which is disposed on the edge side of the display panel and attached to a side wall of the display panel, which can not only protect the display panel, but also contact with the thermally conductive metal to dissipate heat in time.

Figure 8:
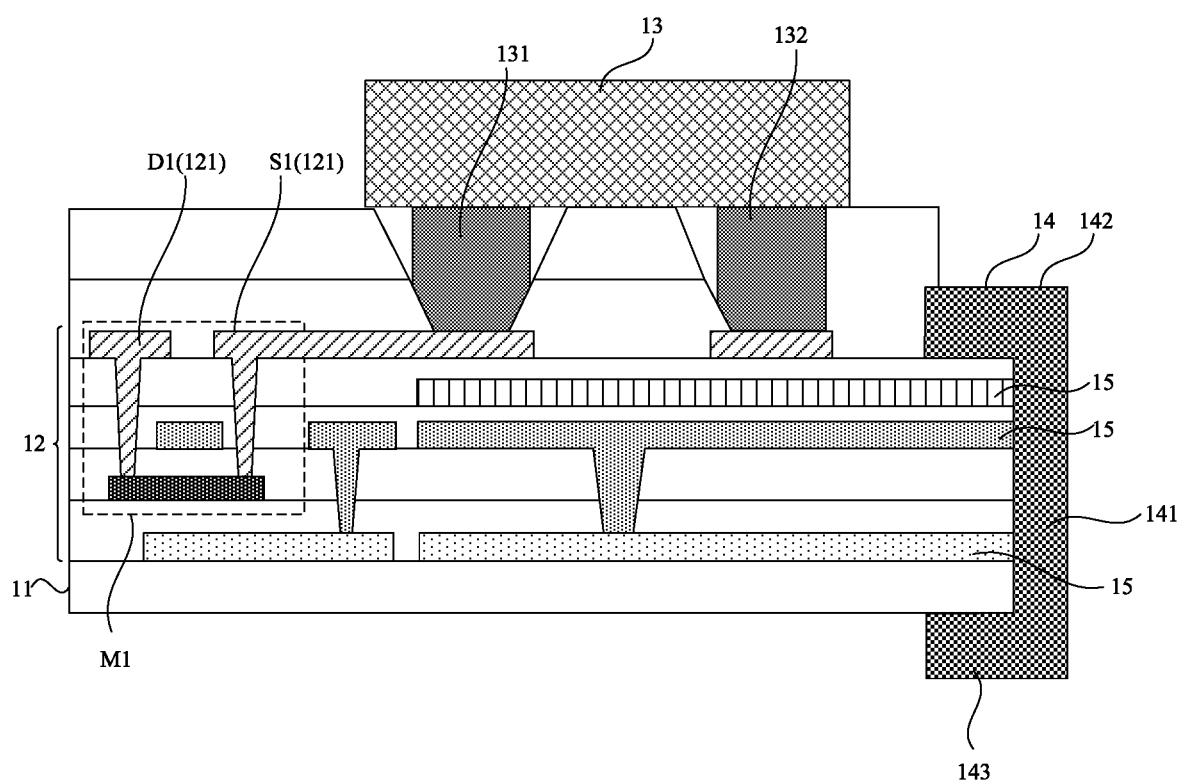
FIG. 8 is a schematic structure view of a display panel provided by another embodiment of the present disclosure.

FIG. 8 is a schematic structure view of a display panel provided by another embodiment of the present disclosure. In an embodiment, the thermally conductive adhesive 14 may further include: a second portion 142 and a third portion 143. The second portion 142, the first portion 141, and the third portion 143 are connected in sequence. The second portion 142 is attached to a surface of the display panel facing away from the substrate 11, and the third portion 143 is attached to the surface of the display panel facing away from the LED chip 13.

The thermally conductive adhesive 14 may further include the second portion 142 disposed on the surface of the display panel facing away from the substrate 11, and the third portion 143 disposed on the surface of the display panel facing away from the LED chip 13. The second portion 142, the first portion 141, and the third portion 143 are sequentially connected to form the thermally conductive adhesive 14, and the thermally conductive adhesive 14 covers the edges of the display panel.

Figure 9:
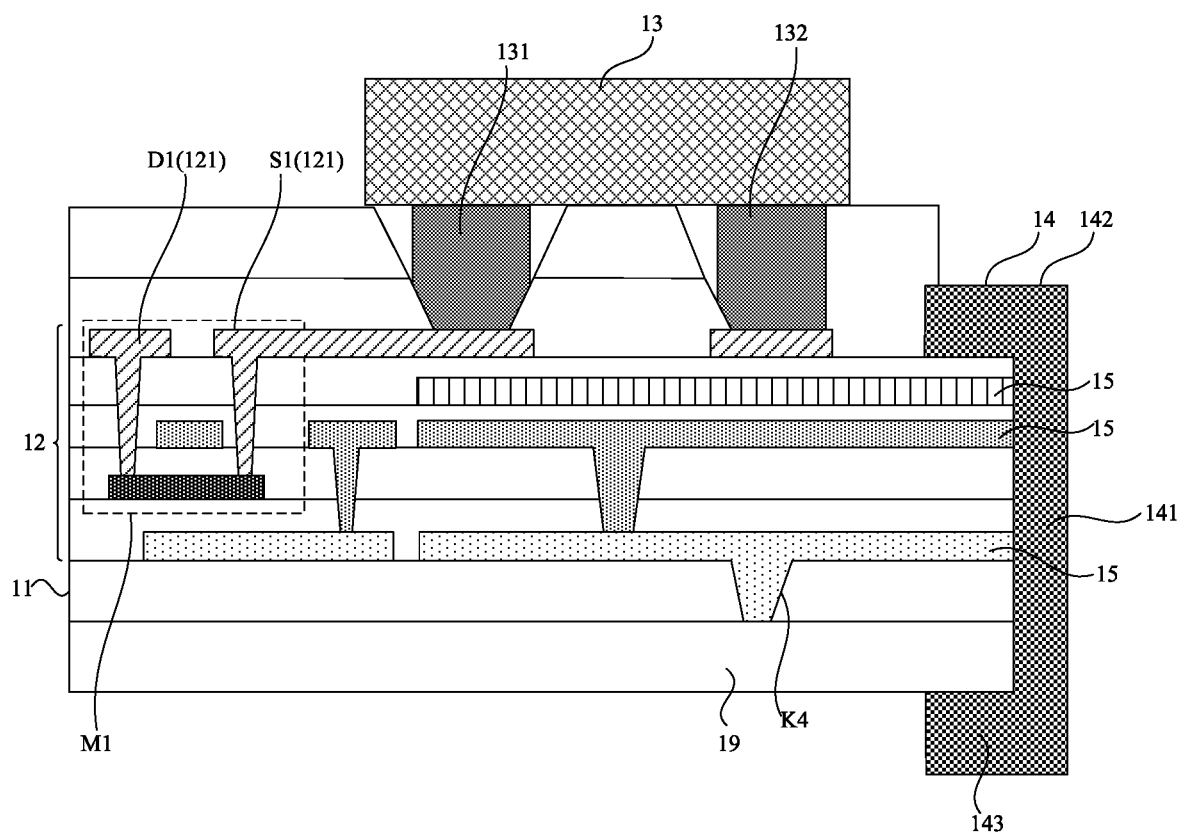
FIG. 9 is a schematic structure view of a display panel provided by another embodiment of the present disclosure.

FIG. 9 is a schematic structure view of a display panel provided by another embodiment of the present disclosure. In an embodiment, the display panel may further include: a heat dissipation plate 19; the heat dissipation plate 19 is disposed on a side of the substrate 11 facing away from the LED chip 13. The fourth through hole K4 is formed on the substrate 11; a layer of thermally conductive metal 15 close to the substrate 11 among the one or more layers of thermally conductive metal 15 passes through the fourth through hole K4 and is connected to the heat dissipation plate 19.

The side of the substrate 11 facing away from the LED chip 13 is also provided with a heat dissipation plate 19, which is used to dissipate heat of the display panel on the back of the display panel. In this embodiment, the fourth through hole K4 can be formed on the substrate 11, and a layer of thermally conductive metal 15 close to the substrate 11 among the above-mentioned one or more layers of thermally conductive metals 15 passes through the fourth through hole K4 to contact the heat dissipation plate 19, thus the thermally conductive metal 15 in this embodiment can not only dissipate heat on the edge sides of the display panel, but also dissipate heat to the heat dissipation plate 19 in a direction perpendicular to the display panel, and thus the heat dissipation plate 19 further improves heat dissipation efficiency of the thermally conductive metal 15 to enhance the characteristics of the first thin film transistor, enhancing reliability of the display panel.

In an embodiment, the layer of thermally conductive metal 15 close to the substrate 11 among one or more layers of thermally conductive metal 15 may be made of molybdenum or an alloy containing molybdenum. In order to prevent corrosion of the thermally conductive metal 15 caused by intrusion of water and oxygen between the substrate 11 and the heat dissipation plate 19, the thermally conductive metal 15 can be set to be made of molybdenum or an alloy containing molybdenum in this embodiment; as molybdenum or an alloy containing molybdenum is characterized by high corrosion resistance, which can prevent oxidation of the thermally conductive metal 15, to effectively prevent impurities from intruding into the display panel, improving reliability of the display panel.

Figure 10:
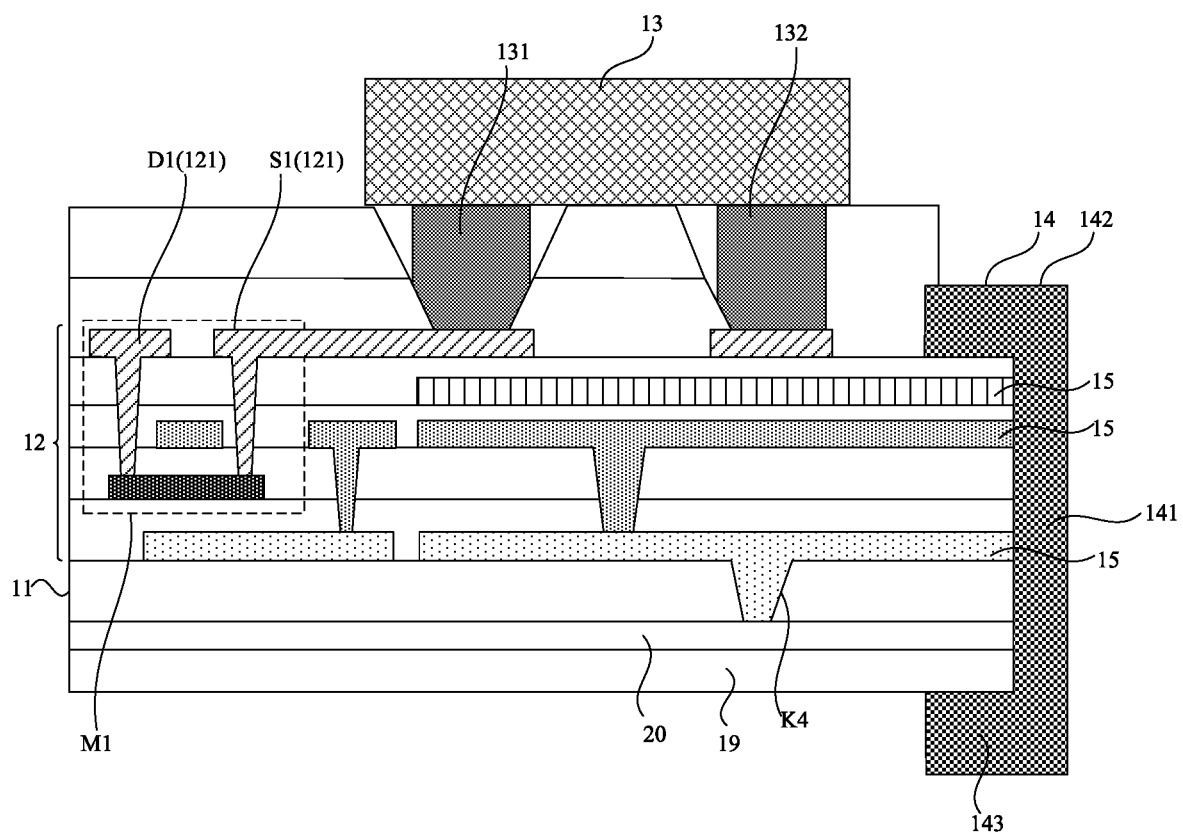
FIG. 10 is a schematic structure view of a display panel provided by another embodiment of the present disclosure.

FIG. 10 is a schematic structure view of a display panel provided by another embodiment of the present disclosure. In an embodiment, the display panel may further include: a sealed thermally conductive layer 20. The sealed thermally conductive layer 20 is attached to a side of the substrate 11 facing away from the driving circuit layer. The layer of thermally conductive metal 15 close to the substrate 11 among the one or more layers of thermally conductive metal 15 passes through the fourth through hole K4 and is in contact with the sealed thermally conductive layer 20. The layer of thermally conductive metal 15 close to the substrate 11 among the one or more layers of thermally conductive metal 15 connects with the heat dissipation plate 19 through the sealed thermally conductive layer 20.

In order to further prevent the thermally conductive metal 15 from being corroded, the sealed thermally conductive layer 20 can be coated on the side of the substrate 11 facing away from the driving circuit layer. In an embodiment, the sealed thermally conductive layer 20 may be made of a resin material with strong sealing capacity and good thermal conductivity. Thus, the layer of thermally conductive metal 15 close to the substrate 11 passes through the fourth through hole K4 on the substrate 11 to contact the sealed thermally conductive layer 20, and the sealed thermally conductive layer 20 can transmit the heat conducted from the thermally conductive metal 15 to the heat dissipation plate 19. In addition, with good airtightness, the sealed thermally conductive layer 20 can effectively prevent intrusion of water and oxygen between the sealed thermally conductive layer 20 and the substrate 11, to effectively prevent the thermally conductive metal 15 passing through the fourth through hole K4 from being corroded, improving the performance of the display panel.

Figure 11:
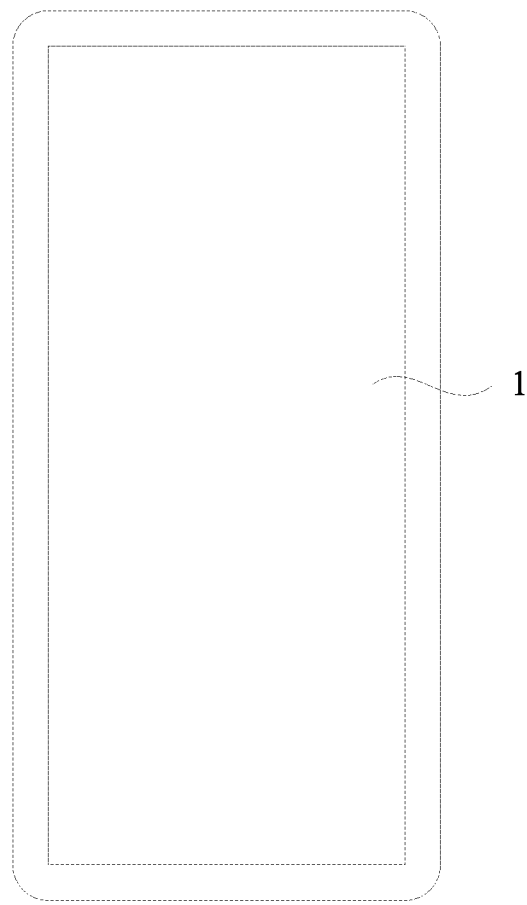
FIG. 11 is a schematic structure view of a display device provided by an embodiment of the present disclosure.

The embodiments of the present disclosure also provide a display device. FIG. 11 is a schematic structure view of a display device provided by the embodiments of the present disclosure, as shown in FIG. 11, the display device provided by the embodiments of the present disclosure includes the display panel 1 described in any embodiment of the present disclosure. The display device may be a mobile phone as shown in FIG. 11, or a computer, a television, a smart wearable device, etc., which is not particularly limited in the embodiments.

The display device provided by the embodiments of the present disclosure includes all the features of the display panel provided by the embodiments of the present disclosure, and has the beneficial effects of all those features, which will not be discussed in detail herein.

What is claimed is:

1. A display panel, comprising: a substrate;
a driving circuit layer, wherein the driving circuit layer is disposed on the substrate and comprises a plurality of driving circuits;
a plurality of LED chips, wherein the plurality of LED chips are located on a side of the driving circuit layer facing away from the substrate; at least one of the plurality of LED chips is electrically connected to a corresponding driving circuit of the plurality of driving circuits; at least one of the plurality of driving circuits comprises at least one first thin film transistor; a source of the first thin film transistor and a drain of the first thin film transistor are located at a first metal layer of the driving circuit layer; the source of the first thin film transistor or the drain of the first thin film transistor is electrically connected to a first electrode of a corresponding LED chip of the plurality of LED chips; and
thermally conductive adhesive, wherein the thermally conductive adhesive is provided on at least part of edges of the display panel;
wherein the substrate is further provided with one or more layers of thermally conductive metal; at least one layer of the one or more layers of thermally conductive metal extends to the edges of the display panel and is in contact with the thermally conductive adhesive.

2. The display panel of claim 1, wherein
the display panel comprises a display region and a non-display region, and the plurality of LED chips are located in the display region; and
the non-display region further comprises a ground wire, and the ground wire is disposed around the display region and is electrically connected to the one or more layers of thermally conductive metal.

3. The display panel of claim 2, wherein the driving circuit layer comprises metal layers and insulating layers, wherein the metal layers and the insulating layers are alternately disposed; and wherein,
the insulating layers on a side of the ground wire facing away from the substrate is provided with a groove structure, and a vertical projection of the groove structure on a plane where the substrate is located covers the ground wire; and
the thermally conductive adhesive fills the groove structure.

4. The display panel of claim 1, wherein a vertical projection of the at least one layer of the one or more layers of thermally conductive metal on a plane where the substrate is located at least partially overlaps the plurality of LED chips.

5. The display panel of claim 1, wherein at least one metal film layer of the driving circuit layer further serves as the one or more layers of thermally conductive metal.

6. The display panel of claim 5, wherein the one or more layers of thermally conductive metal comprises: a first thermally conductive metal and a second thermally conductive metal; and wherein,
the driving circuit layer comprises:
a second metal layer comprising a gate of the first thin film transistor, a first plate of a capacitor, and the first thermally conductive metal; and
a third metal layer comprising a second plate of the capacitor and the second thermally conductive metal; and
the first metal layer is disposed on a side of the third metal layer facing away from the substrate and comprises a common electrode, and the common electrode is electrically connected to a second electrode of at least one of the plurality of LED chips.

7. The display panel of claim 6, wherein the one or more layers of thermally conductive metal further comprises a third thermally conductive metal; and wherein,
the driving circuit layer further comprises:
an active structure layer comprising an active layer of the first thin film transistor; and
a fourth metal layer disposed between the substrate and the active structure layer and comprising a light-shielding layer and the third thermally conductive metal, wherein a projection of the light-shielding layer on a plane where the substrate is located covers the active layer, and the light-shielding layer and the third thermally conductive metal are insulated.

8. The display panel of claim 7, wherein among the first thermally conductive metal, the second thermally conductive metal, and the third thermally conductive metal, at least two adjacent layers of the one or more layers of thermally conductive metal are electrically connected.

9. The display panel of claim 7, wherein the display panel comprises a display region and a non-display region; the non-display region further comprises a ground wire; the ground wire is electrically connected to at least one layer of the one or more layers of thermally conductive metal; and
wherein the ground wire is disposed at one of the first metal layer, the second metal layer, the third metal layer, or the fourth metal layer.

10. The display panel of claim 2, wherein the at least one layer of the one or more layers of thermally conductive metal comprises a plurality of stripe structures all extending in a first direction; and wherein,
a first end of at least one of the plurality of stripe structures is connected to a ground wire segment close to a first edge of the display region; a second end of the at least one of the plurality of stripe structures is connected to the ground wire segment close to a second edge of the display region opposite to the first edge; and
the plurality of LED chips form an array structure arranged in rows in the first direction and in columns in the second direction, and a vertical projection of the plurality of stripe structures on a plane where the substrate is located covers a corresponding row of LED chips, wherein the first direction and the second direction intersect.

11. The display panel of claim 10, wherein
the display region comprises the first edge, a third edge, the second edge, and a fourth edge that are sequentially connected, the first edge and the second edge are opposed to each other in the first direction, and the third edge and the fourth edge are opposed to each other in the second direction;
the display panel further comprises a binding region, and the binding region is located in the non-display region and is close to the fourth edge of the display region; and
the ground wire is disposed around the first edge, the third edge and the second edge of the display region.

12. The display panel of claim 10, wherein
the plurality of stripe structures are provided with a plurality of hollow patterns; and
a vertical projection of the plurality of hollow patterns on the plane where the substrate is located at least partially overlaps the driving circuit layer.

13. The display panel of claim 1, wherein the thermally conductive adhesive comprises a first portion, and the first portion is attached to an edge side of the display panel.

14. The display panel of claim 13, wherein
the thermally conductive adhesive further comprises a second portion and a third portion, and the second portion, the first portion and the third portion are connected in sequence; and
the second portion is attached to a surface of the display panel facing away from the substrate, and the third portion is attached to a surface of the display panel facing away from the plurality of LED chips.

15. The display panel of claim 1, further comprising: a heat dissipation plate, wherein the heat dissipation plate is disposed on a side of the substrate facing away from the plurality of LED chips; and
wherein the substrate is provided with a fourth through hole; one layer of the one or more layers of thermally conductive metal close to the substrate among the one or more layers of thermally conductive metal passes through the fourth through hole and is connected to the heat dissipation plate.

16. The display panel of claim 15, wherein the one layer of the one or more layers of thermally conductive metal close to the substrate among the one or more layers of thermally conductive metal is made of molybdenum or an alloy containing molybdenum.

17. The display panel of claim 15, further comprising: a sealed thermally conductive layer, wherein the sealed thermally conductive layer is disposed attached to a side of the substrate facing away from the driving circuit layer; and
wherein the one layer of the one or more layers of thermally conductive metal close to the substrate among the one or more layers of thermally conductive metal passes through the fourth through hole to contact the sealed thermally conductive layer, and the one layer of the one or more layers of thermally conductive metal close to the substrate among the one or more layers of thermally conductive metal is connected to the heat dissipation plate through the sealed thermally conductive layer.

18. The display panel of claim 1, wherein at least one of the plurality of LED chips is a mini-LED chip or is a micro-LED chip.

19. A display device, comprising a display panel, wherein the display panel comprises:
a substrate;
a driving circuit layer, wherein the driving circuit layer is disposed on the substrate and comprises a plurality of driving circuits;
a plurality of LED chips, wherein the plurality of LED chips are located on a side of the driving circuit layer facing away from the substrate; at least one of the plurality of LED chips is electrically connected to a corresponding driving circuit of the plurality of driving circuits; at least one of the plurality of driving circuits comprises at least one first thin film transistor; a source of the first thin film transistor and a drain of the first thin film transistor are located at a first metal layer of the driving circuit layer; the source of the first thin film transistor or the drain of the first thin film transistor is electrically connected to a first electrode of a corresponding LED chip of the plurality of LED chips; and
thermally conductive adhesive, wherein the thermally conductive adhesive is provided on at least part of edges of the display panel;
wherein the substrate is further provided with one or more layers of thermally conductive metal; at least one layer of the one or more layers of thermally conductive metal extends to the edges of the display panel and is in contact with the thermally conductive adhesive.

20. The display device of claim 19, wherein
the display panel comprises a display region and a non-display region, and the plurality of LED chips are located in the display region; and
the non-display region further comprises a ground wire, and the ground wire is disposed around the display region and is electrically connected to the one or more layers of thermally conductive metal.

* * * * *